US012583190B2

(12) United States Patent
Feng et al.

(10) Patent No.: US 12,583,190 B2
(45) Date of Patent: Mar. 24, 2026

(54) SUBSTRATE-FASTENING DEVICE AND SUBSTRATE-ASSEMBLING STRUCTURE USING SAME

(71) Applicant: Delta Electronics, Inc., Taoyuan City (TW)

(72) Inventors: Yanggui Feng, Taoyuan City (TW); Shaojun Chen, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 484 days.

(21) Appl. No.: 17/833,676

(22) Filed: Jun. 6, 2022

(65) Prior Publication Data

US 2022/0396038 A1 Dec. 15, 2022

(30) Foreign Application Priority Data

Jun. 10, 2021 (CN) .......................... 202110646693.1

(51) Int. Cl.
*B29C 65/54* (2006.01)
*B29L 31/34* (2006.01)
*H05K 1/02* (2006.01)

(52) U.S. Cl.
CPC ....... *B29C 65/54* (2013.01); *B29L 2031/3425* (2013.01); *H05K 1/0201* (2013.01)

(58) Field of Classification Search
CPC ............ B29C 65/54; B29L 2031/3425; H05K 1/0201; H05K 7/142; H05K 7/20509;
(Continued)

(56) References Cited

U.S. PATENT DOCUMENTS 5,408,207 A * 4/1995 Chanteau ............. H05K 3/0061
361/753
7,282,945 B1 * 10/2007 Beaman ................... G01R 3/00
324/754.2
(Continued)

FOREIGN PATENT DOCUMENTS

CN 2519324 Y 10/2002
CN 2676564 Y 2/2005
(Continued)

*Primary Examiner* — Abbas Rashid
*Assistant Examiner* — Caroline Beha
(74) *Attorney, Agent, or Firm* — KIRTON McCONKIE; Evan R. Witt

(57) ABSTRACT

A substrate-fastening device and a substrate-assembling structure are disclosed. The substrate-fastening device includes a base and a fastening component. The base correspondingly carries a substrate including a perforation. The fastening component is disposed on the base, corresponds to the perforation, and includes a supporting portion, a positioning portion, a resin-attaching portion, an end portion and a fixation resin. The supporting portion is disposed on the base to support the substrate. The positioning portion is disposed on a supporting surface of the supporting portion and extended along the perforation. The resin-attaching portion is extended along the perforation. The end portion is connected to the positioning portion through the resin-attaching portion. The fixation resin is disposed around the resin-attaching portion and connected between the end portion and the positioning portion. The fixation resin covers the second surface adjacent to the perforation, and fills the gap between the resin-attaching portion and the perforation.

25 Claims, 14 Drawing Sheets

(58) Field of Classification Search
CPC . H05K 2201/09745; H05K 2201/1003; H05K
2203/167; H05K 1/0203; H05K 1/02;
H05K 13/046; F16B 2200/83; F16B 5/08;
F16B 11/006
See application file for complete search history.

(56) References Cited

U.S. PATENT DOCUMENTS

| | | | | |
|---|---|---|---|---|
| 2005/0105860 A1* | 5/2005 | Oono | .................. | G02B 6/4236 |
| | | | | 385/88 |
| 2010/0255722 A1* | 10/2010 | Sander | ................ | H01R 12/585 |
| | | | | 439/587 |
| 2015/0308632 A1* | 10/2015 | Ueno | ........................ | F21K 9/60 |
| | | | | 362/249.14 |
| 2016/0225693 A1* | 8/2016 | Tolentino | ............. | H01L 23/315 |

FOREIGN PATENT DOCUMENTS

| | | | | | |
|---|---|---|---|---|---|
| CN | 100365805 | C | | 1/2008 | |
| CN | 104516428 | A | | 4/2015 | |
| CN | 104661470 | A | | 5/2015 | |
| CN | 208691625 | U | | 4/2019 | |
| CN | 209731873 | U | | 12/2019 | |
| CN | 209949568 | U | | 1/2020 | |
| CN | 212413632 | U | | 1/2021 | |
| CN | 212413644 | U | * | 1/2021 | |
| CN | 212519734 | U | * | 2/2021 | .............. H05K 7/20 |
| CN | 219164992 | U | | 6/2023 | |
| JP | 2005038957 | A | | 2/2005 | |
| JP | 2011003618 | A | | 1/2011 | |
| KR | 830002727 | Y1 | | 12/1983 | |
| KR | 960036061 | U | | 12/1996 | |
| TW | 200915508 | A | | 4/2009 | |

* cited by examiner

1

1a

SUBSTRATE-FASTENING DEVICE AND SUBSTRATE-ASSEMBLING STRUCTURE USING SAME

CROSS-REFERENCE TO RELATED APPLICATION

This application claims priority to China Patent Application No. 202110646693.1, filed on Jun. 10, 2021. The entire contents of the above-mentioned patent application are incorporated herein by reference for all purposes.

FIELD OF THE INVENTION

The present disclosure relates to a technology field of power electronic devices, and more particularly to a substrate-fastening device and a substrate-assembling structure using the same for maintaining the stability of the overall structure and ensuring the substrate-assembling structure withstand the high temperature process of reflow soldering.

BACKGROUND OF THE INVENTION

With the continuous development of integration and miniaturization of electronic modules, how to combine and fasten an electronic device with a heat dissipation base plate stably in a limited space has become a difficult problem that must be faced today. Due to the dense density of electronic components disposed on the circuit board, the area configured to fasten the heat dissipation base plate is limited. On the other hand, in response to the requirements of the manufacturing process, some components are added on the assembled structure through several high-temperature processes such as multiple reflow soldering.

An approach to fasten the circuit board and the heat dissipation base plate is using the screws. The screws made of high temperature resistant metal materials is used for meeting the high temperature requirements and for insurance to maintain electrical safety area of the electronic devices, the circuit board has to provide enough area for fastening and assembling of the structure. Another approach to fasten the assembling structure of the circuit board and the heat dissipation base plate is welding. The solder paste is re-melted due to the high temperature when the assembly structure is subjected to the high temperature reflow soldering. The re-melted solder paste may affect the electrical performance of peripheral electronic devices. The solder paste having the high melting point is used for the aforementioned approach may to generate cracks on the solder paste after the module is re-soldered at high temperature.

SUMMARY OF THE INVENTION

An object of the present disclosure is to provide a substrate-fastening device and a substrate-assembling structure using the same. With a hook-shaped structure and a fixation resin combined to form a buckle as the substrate-fastening device, a substrate is fastened to a base stably. It prevents the substrate from moving relative to the substrate-fastening device. The substrate, the base and the substrate-fastening device are combined to form an integrated substrate-assembling structure as a whole, which is allowed to withstand the subsequent high temperature processes of reflow soldering. Since the fixation resin has the features of good adhesion, strong tensile and compressive strength, and good resistance at high temperature and low temperature, and is not easy to peel off, as the hook-sharped structure formed of the metal material is surrounded by the fixation resin to form the buckle, it ensures that the substrate-assembling structure is not disassembled or loosen during the high temperature process of reflow soldering. Furthermore, the hook-shaped structure formed of the metal material has high mechanical strength and occupies a small space on the substrate. It is beneficial to the integrated design of the entire module.

Another object of the present disclosure is to provide a substrate-fastening device and a substrate-assembling structure using the same. When the substrate is fastened to the substrate-fastening device, the bottom surface of the substrate is supported by a supporting portion, and the substrate is sleeved on a positioning portion through the perforation thereof for positioning. The adhesive portion is connected to the end portion with the hook-sharped structure, and combined with the fixation resin to fasten the substrate stably. Since the fixation resin is in a fluid state before curing, it is easy to fill the gap between the perforation of the substrate and the resin-attaching portion, and be attached to the resin-attaching portion between the positioning portion and the end portion. After the fixation resin is cured, the substrate is fastened to the base to form the substrate-assembling structure as a whole, which is allowed to withstand the high temperature processes of multiple reflow soldering. Furthermore, the positioning of the substrate-fastening device and the substrate, and the filling and curing of the fixation resin are allowed to realize the production through the automated processes. The stability and high temperature resistance of the substrate-assembling structure are also helpful of withstanding the high temperature processes of multiple reflow soldering, and further realizing the production through the automated processes. In case of that the substrate assembling structure is applied to the fastening of the circuit board and the heat dissipation base plate, after the circuit board and the heat dissipation base plate are fastened, additional devices are assembled through the high-temperature processes of multiple reflow soldering. It is helpful of increasing the process variability, simplifying the heat dissipation assembling process, and realizing the whole production through the automated processes. Moreover, the purposes of reducing product cost and improving product competitiveness are achieved.

In accordance with an aspect of the present disclosure, a substrate-fastening device is provided and includes a base and at least one fastening component. The base is configured to carry correspondingly a substrate. The substrate includes at least one perforation, and a first surface and a second surface opposite to each other. The perforation is passed through the first surface and the second surface, and the first surface of the substrate faces the base. The at least one fastening component is disposed on the base and spatially corresponding to each perforation in one-to-one correspondence. Each of the at least one fastening component includes a supporting portion, a positioning portion, a resin-attaching portion, an end portion and a fixation resin. The supporting portion includes a supporting surface disposed on the base, wherein the supporting portion is connected between the first surface of the substrate and the base, and the supporting surface is attached to the first surface. The positioning portion is disposed on the supporting surface of the supporting portion and extended along the perforation. The resin-attaching portion is connected to the positioning portion, wherein the resin-attaching portion is extended from an interior of the perforation of the substrate and passes through the second surface, and a gap is formed between an outer peripheral wall of the resin-attaching portion and an inner peripheral wall of the perforation. The end portion is connected to the positioning portion through the resin-attaching portion. The fixation resin is disposed around the outer peripheral wall of the resin-attaching portion and connected between the end portion and the positioning portion, wherein the fixation resin covers a part of the second surface adjacent to a peripheral edge of the perforation, and fills the gap.

In accordance with another aspect of the present disclosure, a substrate-assembling structure is provided and includes a substrate and a substrate-fastening device. The substrate includes at least one perforation, and a first surface and a second surface opposite to each other. The perforation is passed through the first surface and the second surface. The substrate-fastening device includes a base and at least one fastening component. The base carries the substrate, wherein the first surface faces the base. The at least one fastening component is disposed on the base and spatially corresponding to each perforation in one-to-one correspondence. Each of the at least one fastening component includes a supporting portion, a positioning portion, a resin-attaching portion, an end portion and a fixation resin. The supporting portion includes a supporting surface disposed on the base and, wherein the supporting portion is connected between the first surface of the substrate and the base, and the supporting surface is attached to the first surface. The positioning portion is disposed on the supporting surface of the supporting portion and extended along the perforation. The resin-attaching portion is connected to the positioning portion, wherein the resin-attaching portion is extended from an interior of the perforation of the substrate and passes through the second surface, and a gap is formed between an outer peripheral wall of the resin-attaching portion and an inner peripheral wall of the perforation. The end portion is connected to the positioning portion through the resin-attaching portion. The fixation resin is disposed around the outer peripheral wall of the resin-attaching portion and connected between the end portion and the positioning portion, wherein the fixation resin covers a part of the second surface adjacent to a peripheral edge of the perforation, and fills the gap.

BRIEF DESCRIPTION OF THE DRAWINGS

The above contents of the present disclosure will become more readily apparent to those ordinarily skilled in the art after reviewing the following detailed description and accompanying drawings, in which.

Figure 7:
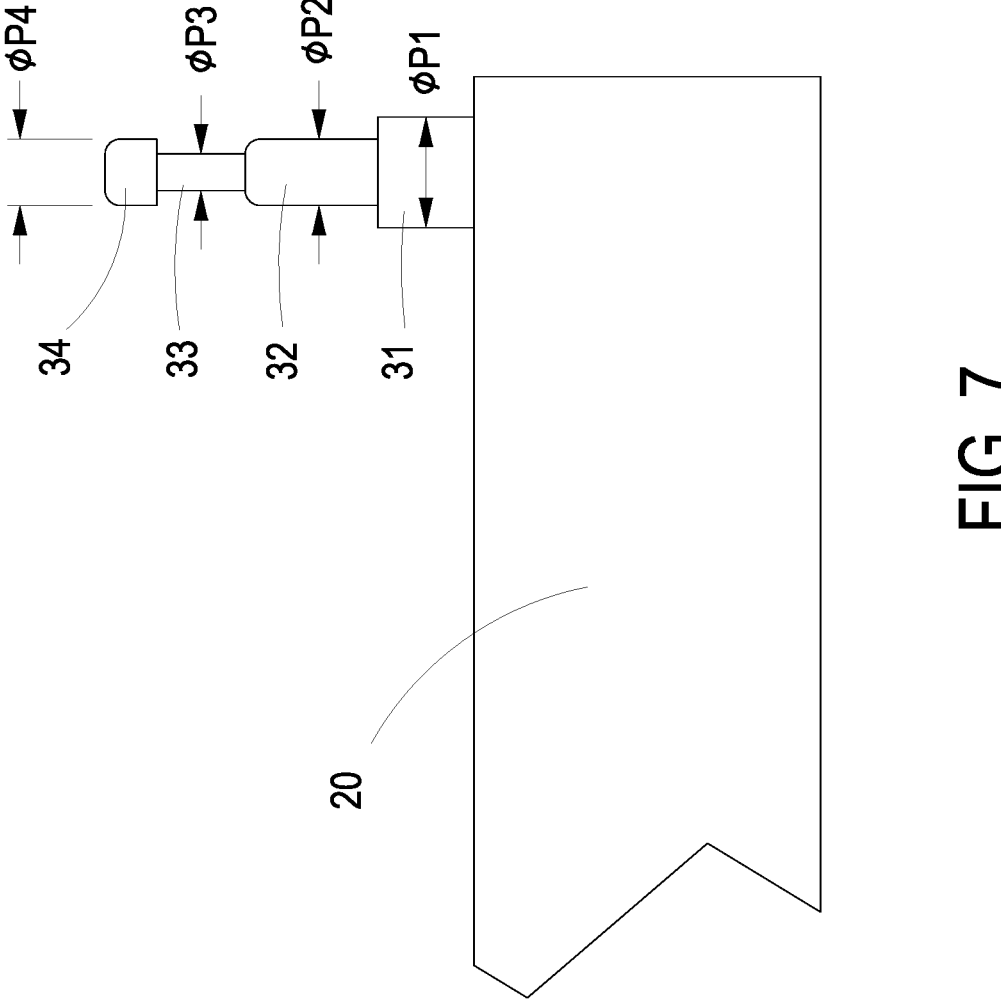
Figure 8:
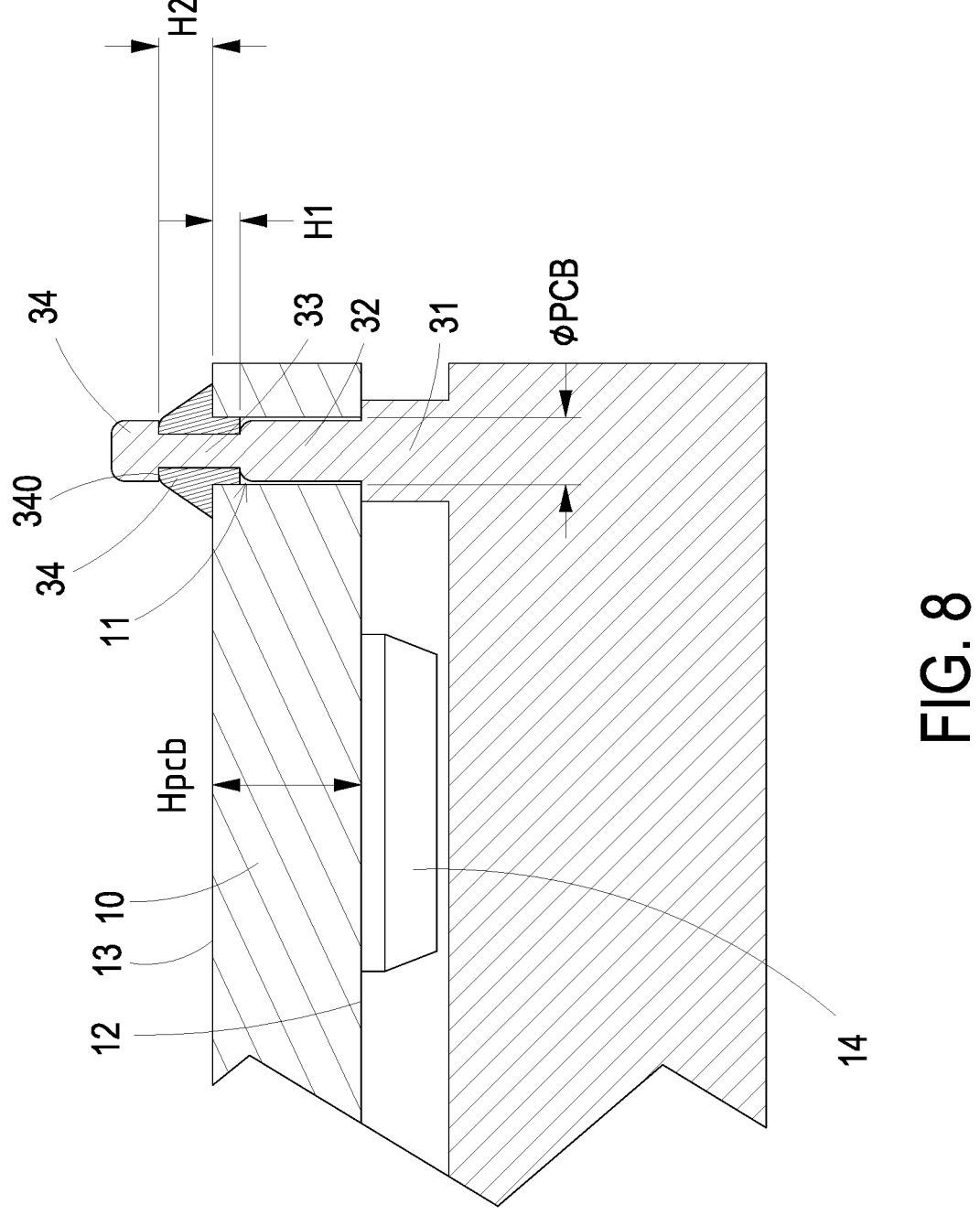
Figure 9A:
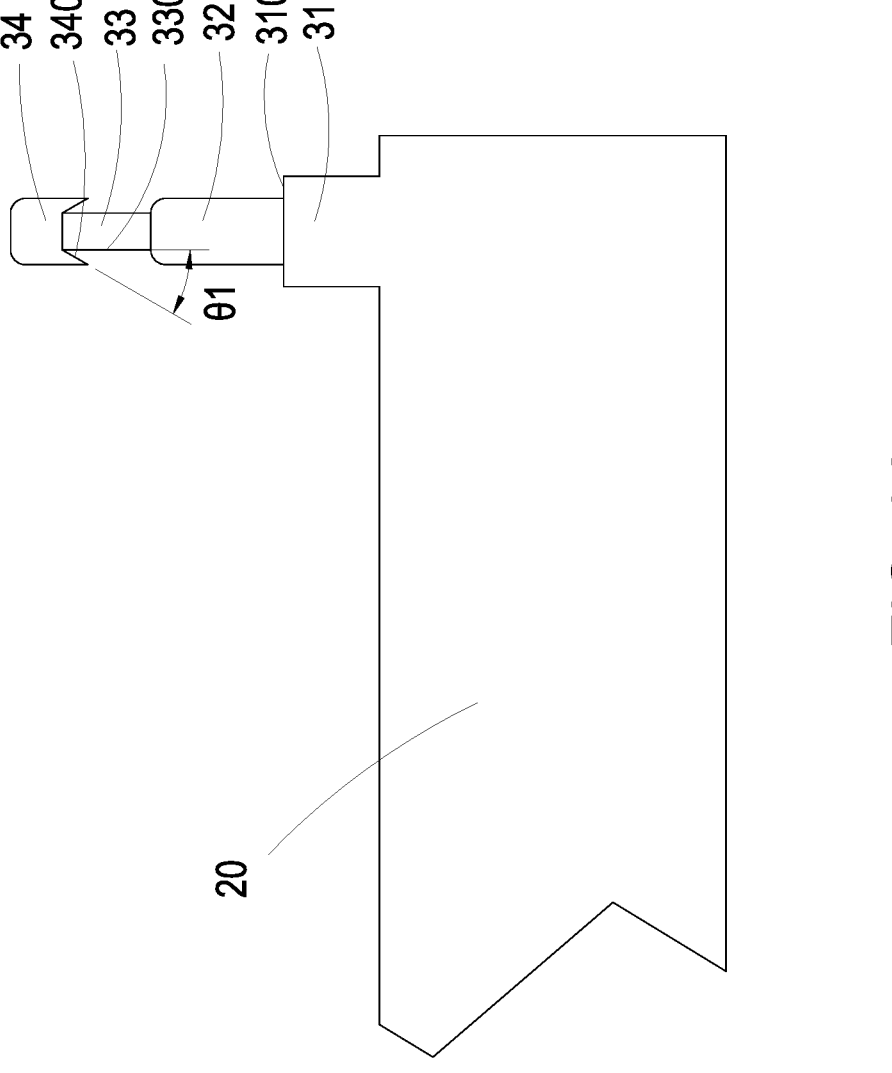
Figure 9B:
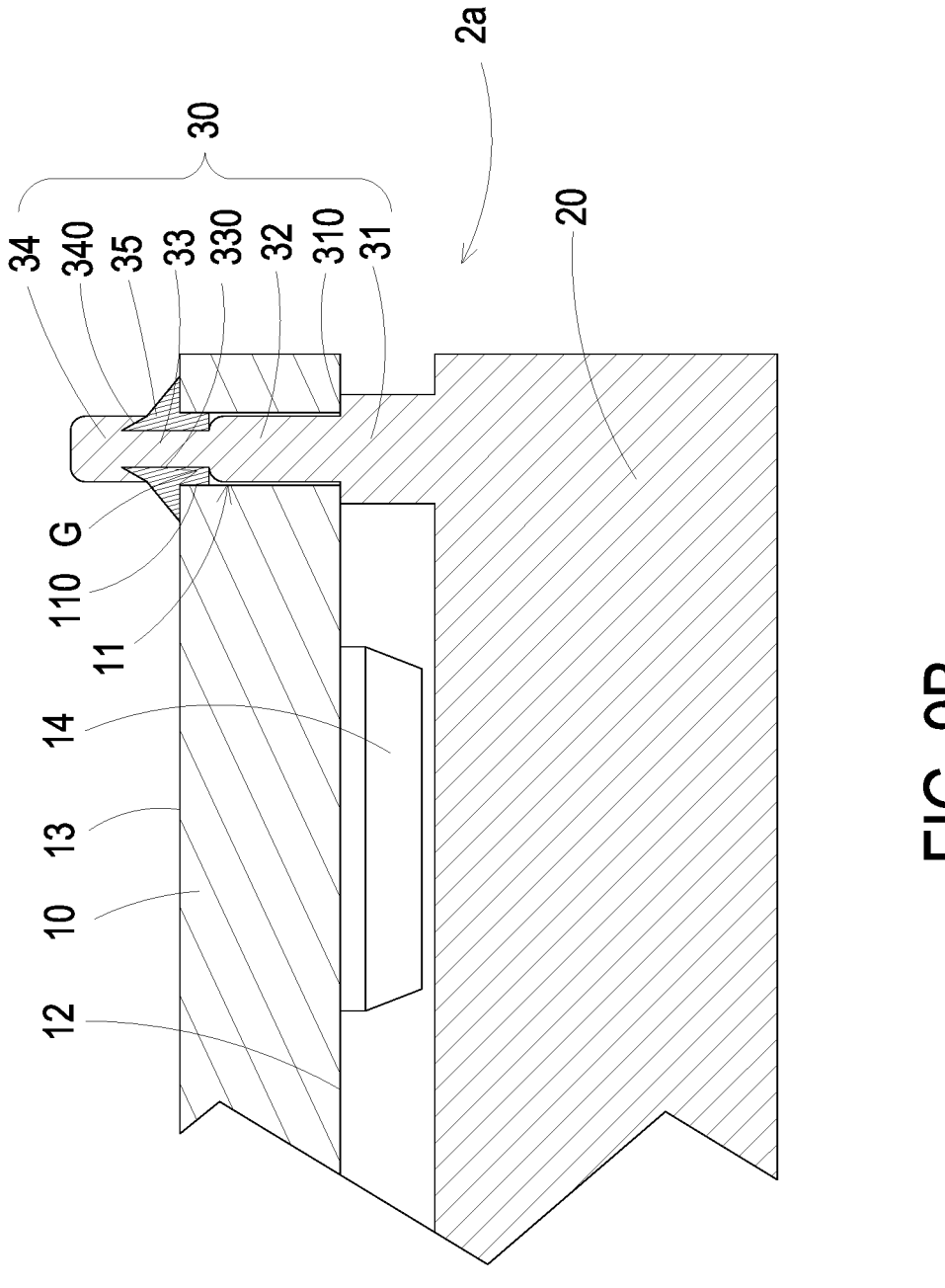
Figure 10A:
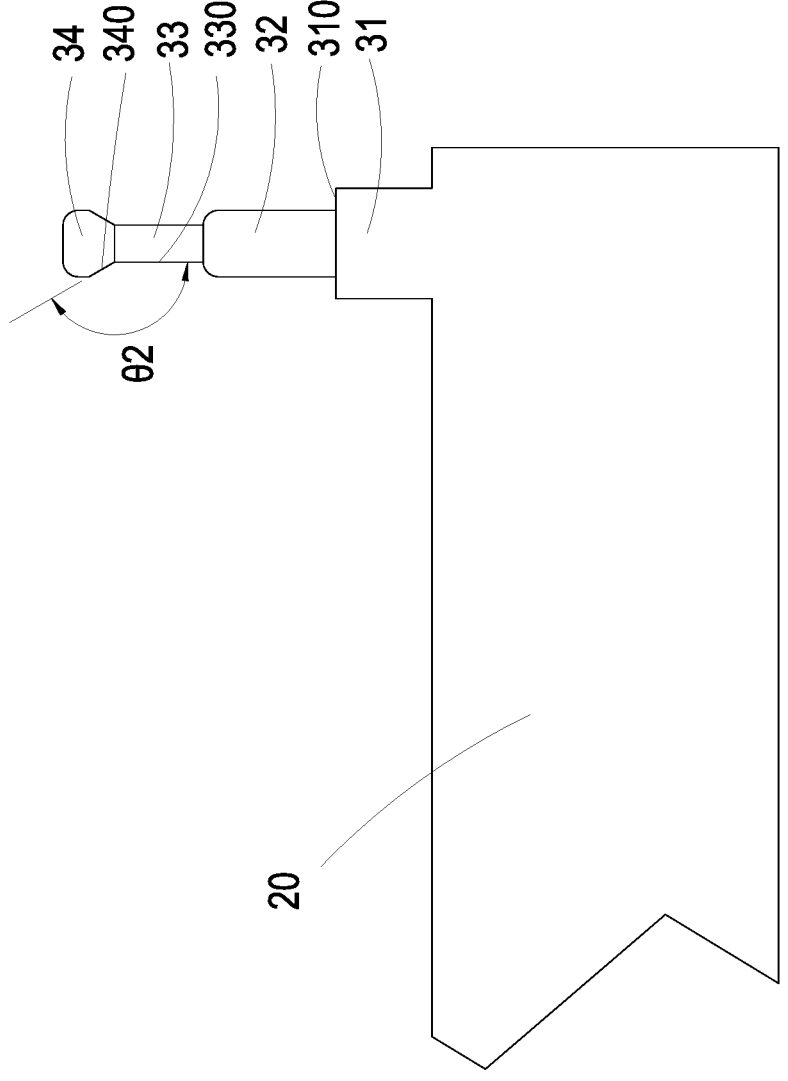
Figure 10B:
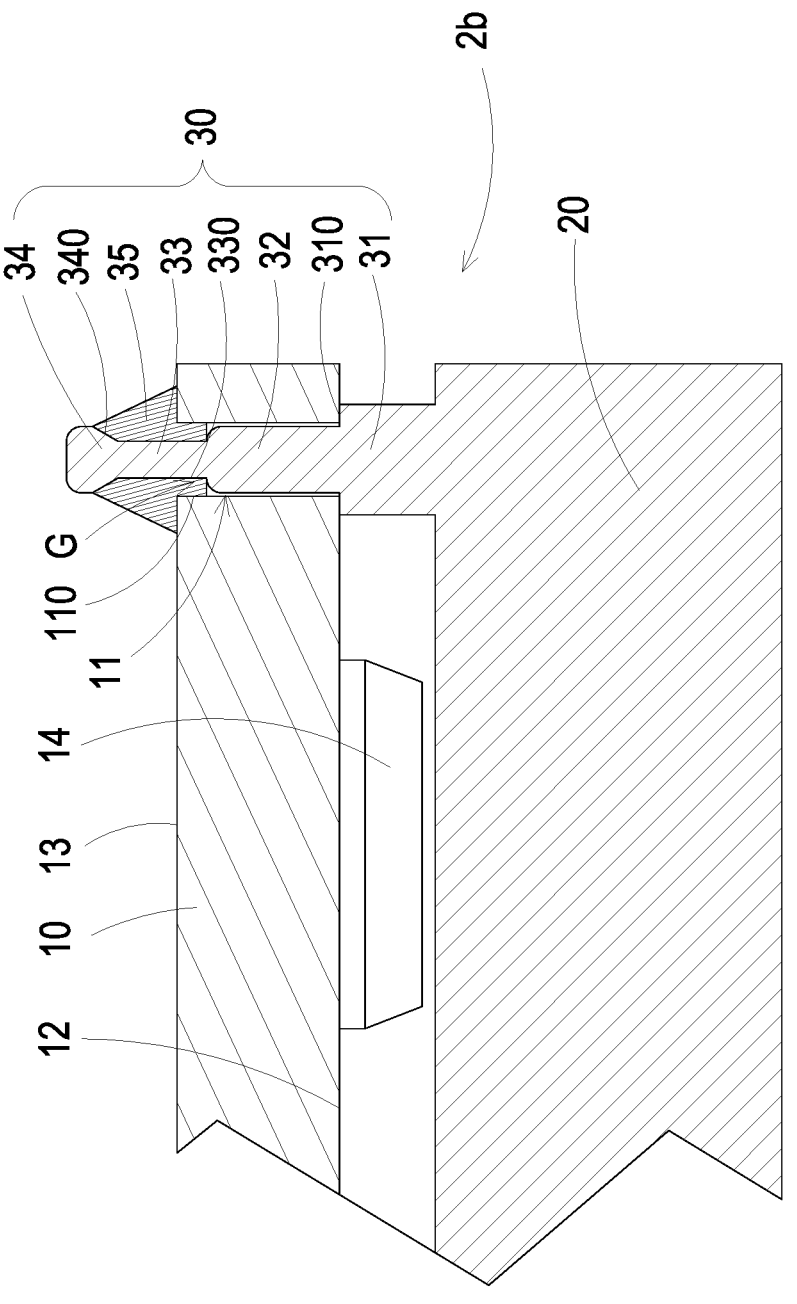

4 portion and the resin-attaching portion of the substrate-fastening device according to different embodiments of the present disclosure;

FIG. 7 is a partial lateral view illustrating the relative size relationships of the supporting portion, the positioning portion, the resin-attaching portion and the end portion of the substrate-fastening device according to the first preferred embodiment of the present disclosure;

FIG. 8 is a partial cross-sectional view illustrating the relative size relationships of the positioning portion, the resin-attaching portion and the end portion relative to the substrate assembled in the substrate-assembling structure according to the first embodiment of the present disclosure;

FIG. 9A is a partial lateral view illustrating a substrate-fastening device before assembling according to a second embodiment of the present disclosure;

FIG. 9B is a partial cross-sectional view illustrating the substrate-assembling structure according to the second embodiment of the present disclosure;

FIG. 10A is a partial lateral view illustrating a substrate-fastening device before assembling according to a third embodiment of the present disclosure; and FIG. 10B is a partial cross-sectional view illustrating the substrate-assembling structure according to the third embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 1:
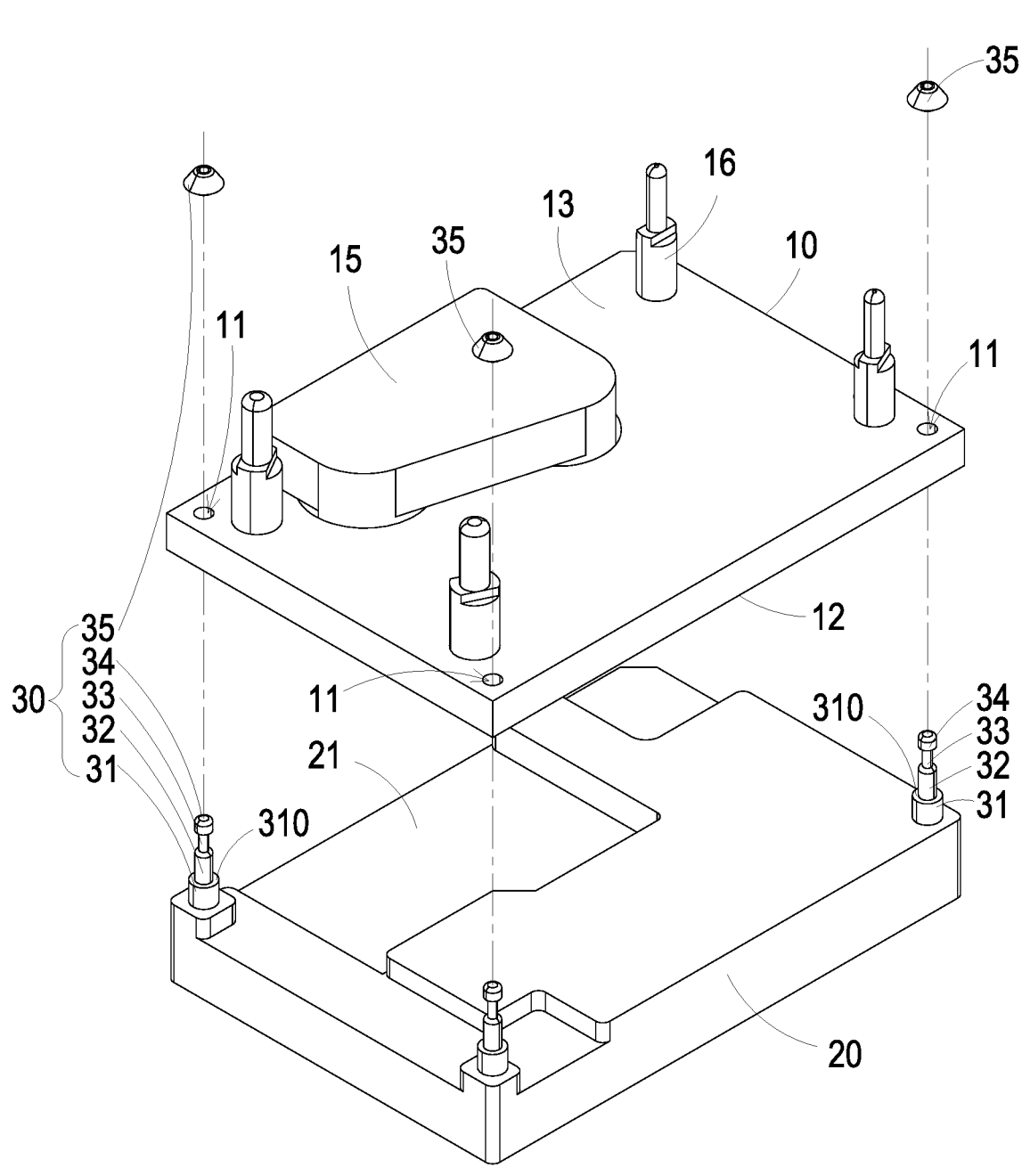
FIG. 1 is an exploded view illustrating a substrate-assembling structure according to a first embodiment of the present disclosure.
Figure 2:
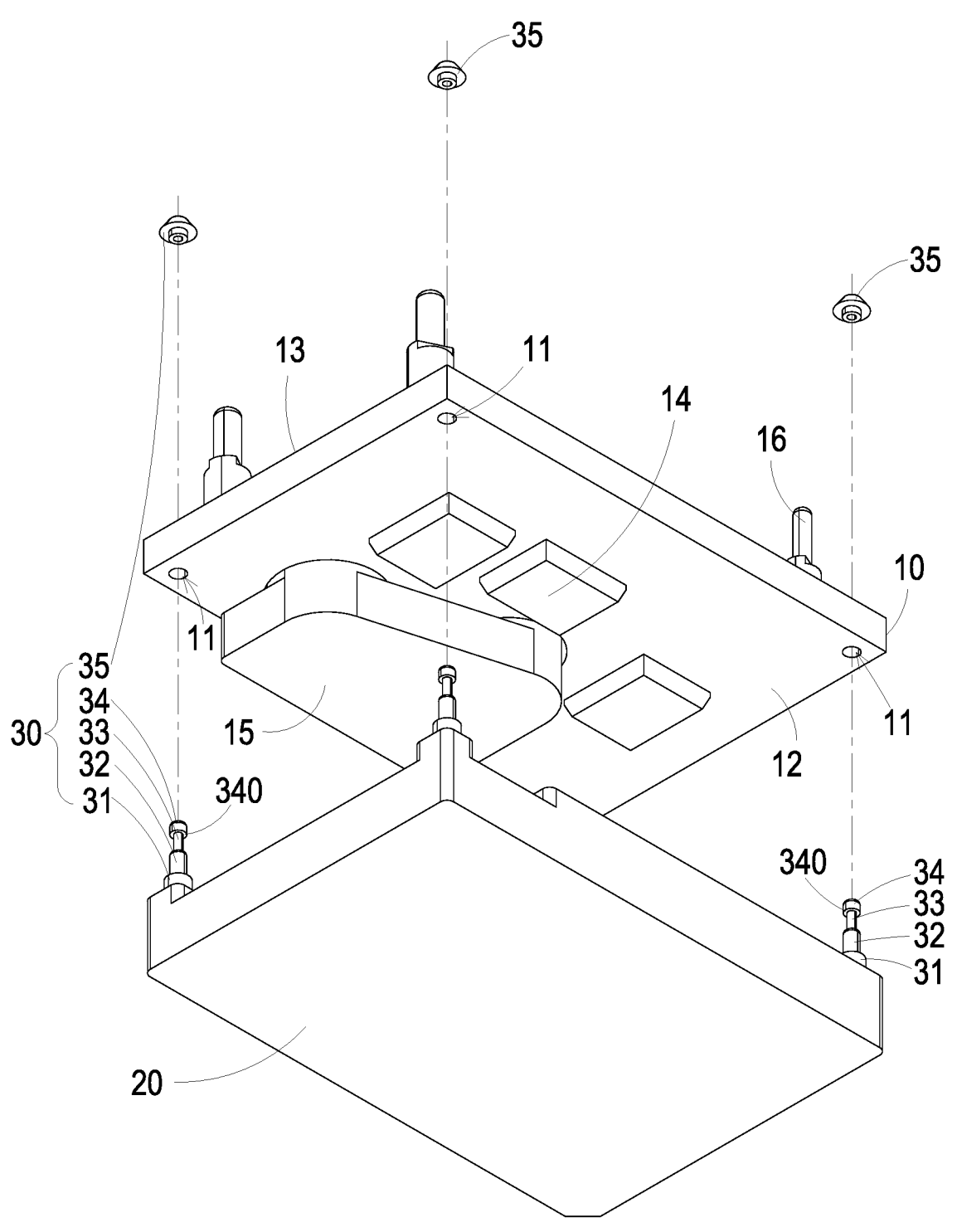
FIG. 2 is an exploded view illustrating the substrate-assembling structure according to the first embodiment of the present disclosure and taken from another perspective.
Figure 3:
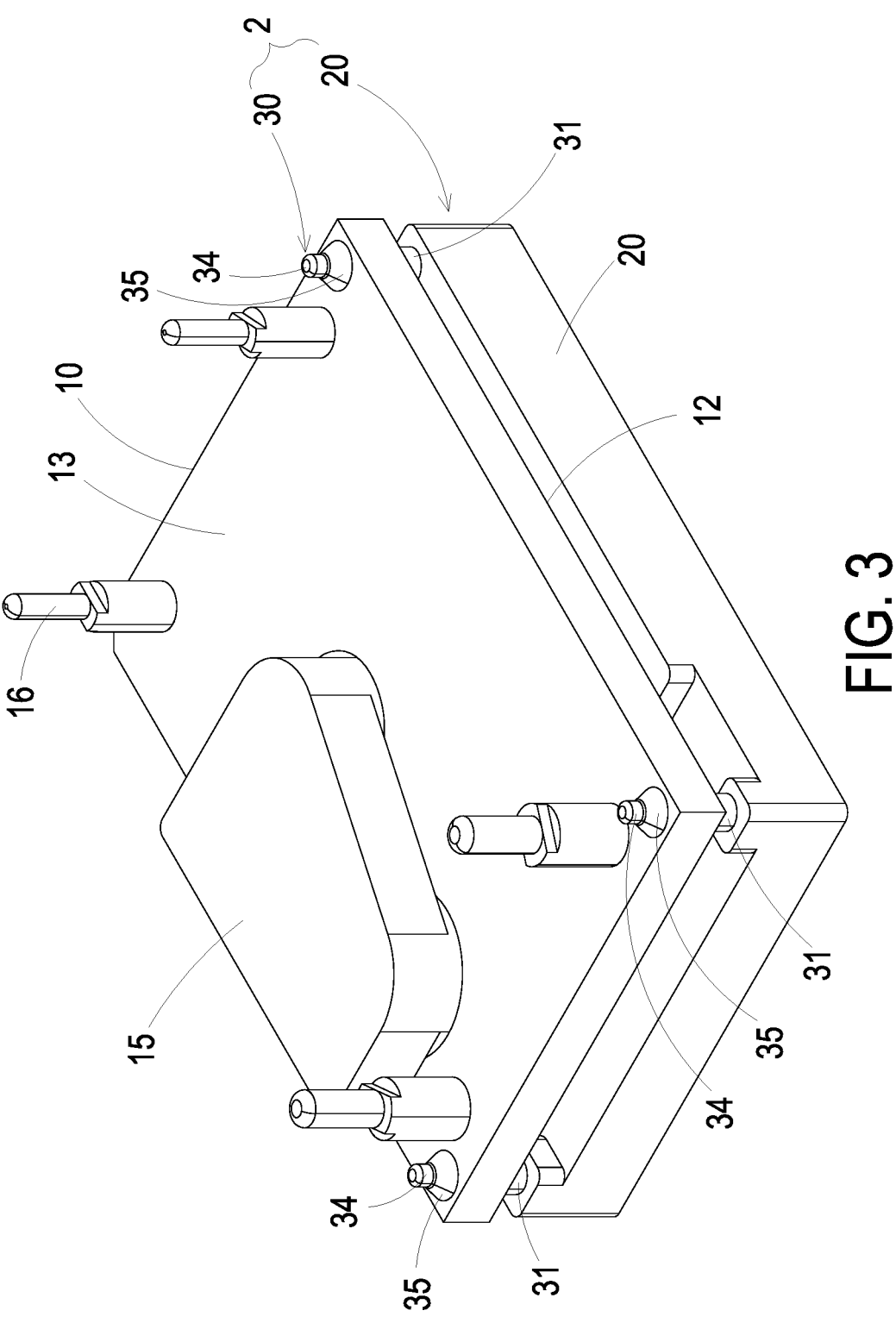
FIG. 3 is a schematic structural view illustrating the substrate-assembling structure according to the first embodiment of the present disclosure.
Figure 4:
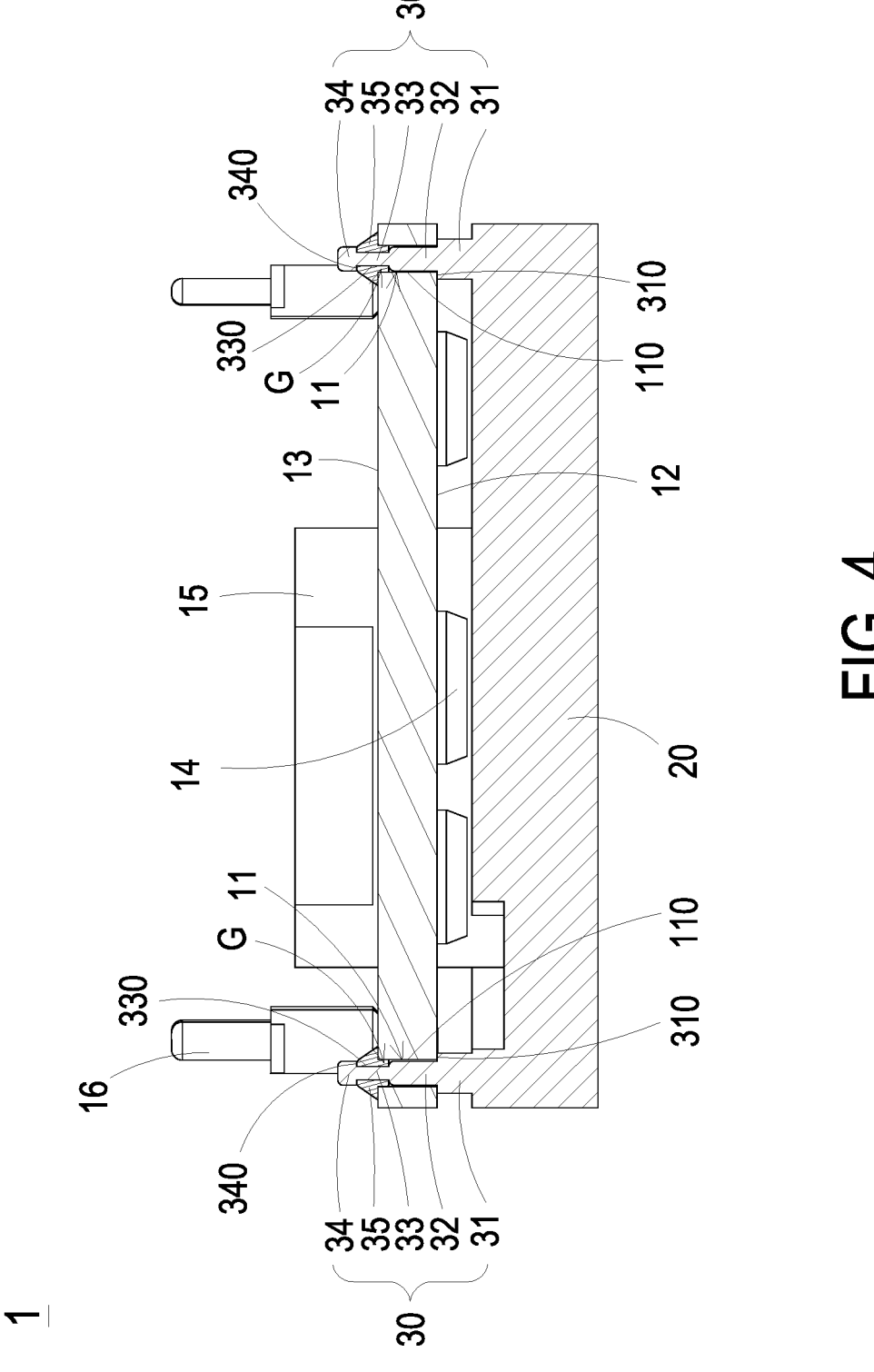
FIG. 4 is a schematic cross-sectional view illustrating the substrate-assembling structure according to the first embodiment of the present disclosure.

FIG. 1 and FIG. 2 are exploded view illustrating a substrate-assembling structure according to a first embodiment of the present disclosure. FIG. 3 is a schematic structural view illustrating the substrate-assembling structure according to the first embodiment of the present disclosure. FIG. 4 is a schematic cross-sectional view illustrating the substrate-assembling structure according to the first embodiment of the present disclosure. In the embodiment, a substrate-assembling structure 1 is formed by fastening a substrate 10 through a substrate-fastening device 2. Preferably but not exclusively, the substrate 10 is a circuit board and includes at least one perforation 11, a first surface 12 and a second surface 13. The first surface 12 and the second surface 13 are opposite to each other. The perforation 11 is passed through the first surface 12 and the second surface 13. In the embodiment, the substrate-fastening device 2 is configured to carry correspondingly the substrate 10, so as to form the substrate-assembling structure 1 as a whole to withstand the subsequent high temperature producing processes, such as the reflow soldering. In the embodiment, the substrate-fastening device 2 includes a base 20 and at least one fastening component 30. The base 20 is configured to correspondingly carry the substrate 10 through the at least one fastening component 30. The first surface 12 of the substrate 10 faces the base 20. The at least one fastening component 30 is disposed on the base 20 and spatially corresponding to the at least one perforation 11 in one-to-one correspondence. Preferably but not exclusively, in the embodiment, the substrate 10 includes three perforation 11 disposed adjacent to three corners of the substrate 10, three fastening components 30 spatially corresponding to the three perforations 11 in one-to one correspondence. The three fastening components 30 disposed on the base 20 pass through the three perforations 11 of the substrate 10, respectively, so as to position the substrate 10 on the base 20 and support stably. Certainly, the present disclosure is not limited thereto. In other embodiments, the substrate 10 is carried on the base 20, and fastened to the base 20 through one single fastening component 30.

In the embodiment, each of the at least one fastening component 30 includes a supporting portion 31, a positioning portion 32, a resin-attaching portion 33, an end portion 34 and a fixation resin 35. The supporting portion 31 is disposed on the base 20 and includes a supporting surface 310. Preferably but not exclusively, the supporting portion 31 is connected between the first surface 12 of the substrate 10 and the base 20, and the supporting surface 310 is attached to the first surface 12 of the substrate 10. In the embodiment, the positioning portion 32 is disposed on the supporting surface 310 of the supporting portion 31 and extended along the perforation 11. The resin-attaching portion 33 is connected to the positioning portion 32. Moreover, the resin-attaching portion 33 is extended from an interior of the perforation 11 of the substrate 10 and passes through the second surface 13. A gap G is formed between an outer peripheral wall 330 of the resin-attaching portion 33 and an inner peripheral wall 110 of the perforation 11. The end portion 34 is connected to the positioning portion 32 through the resin-attaching portion 33. The fixation resin 35 is disposed around the outer peripheral wall 330 of the resin-attaching portion 33 and connected between the end portion 34 and the positioning portion 32. In the embodiment, the fixation resin 35 covers a part of the second surface 13 adjacent to a peripheral edge of the perforation 11, and fills the gap G. Notably, a hook-shaped structure is collaboratively formed by the supporting portion 31, the positioning portion 32, the resin-attaching portion 33 and the end portion 34 of the fastening component 30. With the hook-shaped structure and the fixation resin 35 combined to form a buckle as the substrate-fastening device 2, the substrate 10 is fastened to the base 20 stably. It prevents the substrate 10 from moving to the substrate-fastening device 2 relatively. The substrate 10 and the substrate-fastening device 2 are combined to form an integrated substrate-assembling structure 1 as a whole. It facilitates the substrate-assembling structure 1 to withstand the subsequent processes or meet the requirements of the design.

Preferably but not exclusively, in the embodiment, the base 20 is a heat dissipation device, such as the heat dissipation base plate. Preferably but not exclusively, the substrate 10 is a circuit board includes at least one electronic device 14, a magnetic component 15 and conductive component 16. The base 20 further includes a recess portion 21, which is spatially corresponding to and partially accommodates the larger device, such as the magnetic component 15 disposed on the substrate 10, so as to improve the power density overall and heat dissipation performance. Moreover, in order to increase the flexibility of the manufacturing process, simplify the assembly process of the heat dissipation components, and realize the production through the automated processes, the base 20 of the heat dissipation base plate and the substrate 10 such as the circuit substrate are fastened through at least one fastening component 30 to form the substrate-assembling structure 1. The substrate-assembling structure 1 is allowed to withstand at least more than one time of the high temperature soldering processes, such as reflow soldering. Preferably but not exclusively, the substrate-assembling structure 1 is mounted and electrically connected to other devices through the conductive component 16, it prevents the soldering joints on the base 20 and the substrate 10 to re-melt during the further reheating processes, and the displacing or falling off of the electronic devices 14 or the magnetic component 15 mounted on the substrate-assembling structure 1 is avoided. Consequently, the purposes of improving the reliability and the variability of the manufacturing process, simplify the assembling process of the heat dissipation components and realizing the whole production through the automated processes are achieved. Furthermore, in the embodiment, the substrate-assembling structure 1 includes at least one electronic device 14 such as a switch. Preferably but not exclusively, the electronic device 14 is pressed and disposed between the base 20 and the substrate 10. The base 20 and the substrate 10 are fastened to each other through the fastening component 30. As the substrate-assembling structure 1 is subjected to the high temperature soldering processes as reflow soldering, the soldering joints between the electronic device 14 and the substrate 10 are prevented from being re-melted, and the displacing or falling off is avoided. In addition, the positioning of the substrate-fastening device 2 to the substrate 10, and the filling and curing of the fixation resin 35 are realized by the automated production. The stability and high temperature resistance of the substrate-fastening device 2 are helpful of withstanding multiple times of the high temperature soldering processes, such as reflow soldering, and further realize the automated production. When the substrate 10 of the circuit board is fastened to the substrate-fastening device 2, the at least one electronic device 14, the magnetic component 15 and the conductive component 16 are mounted through the high temperature processes of multiple reflow soldering after the substrate 10 of the circuit board and the base 20 of the heat dissipation base plate are fastened to form the substrate-assembling structure 1, so as to increase the flexibility of the manufacturing process, simplify the assembly process of the heat dissipation components, and realize the automated production. Thus, the purpose of reducing the cost of the product and improving the competitiveness of the product are achieved. In other embodiment, the at least one electronic device 14, the magnetic component 15 and the conductive component 16 are pre-installed on the substrate 10 before the substrate 10 and the base 20 of the heat dissipation base plate are fastened to form the substrate-assembling structure 1. The present disclosure is not limited thereto, and not redundantly described hereafter.

Figure 5A:
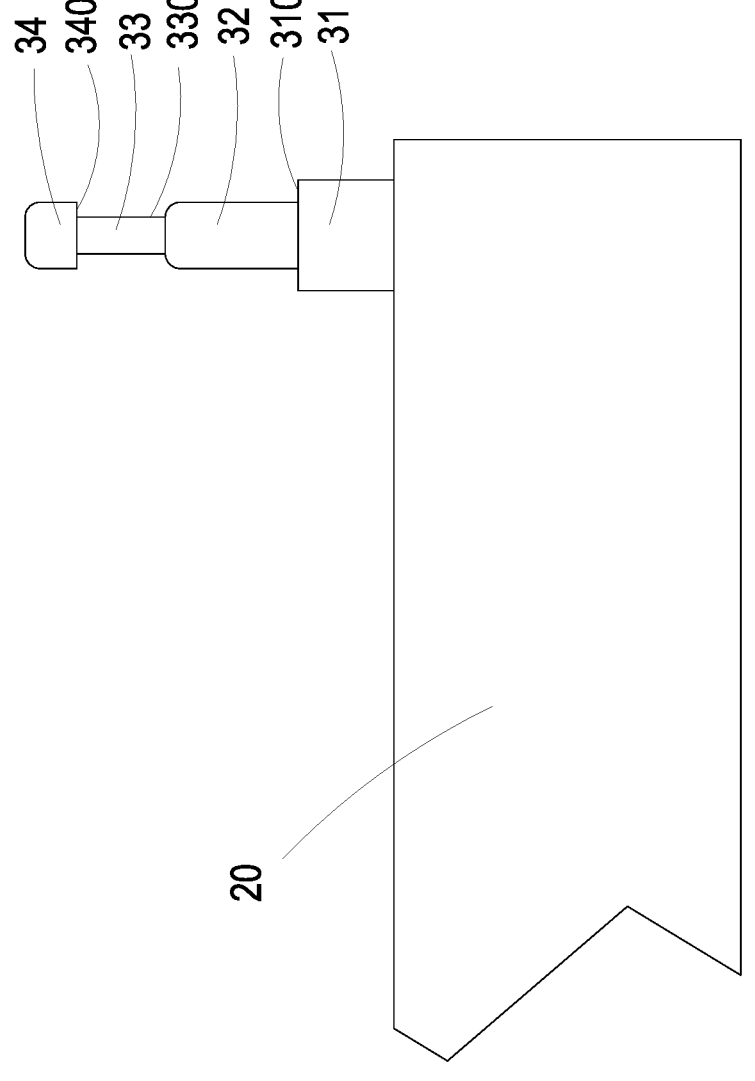
FIGS. 5A to 5C are partial cross-sectional views illustrating an assembling process of the substrate-assembling structure according to the first embodiment of the present disclosure.
Figure 5B:
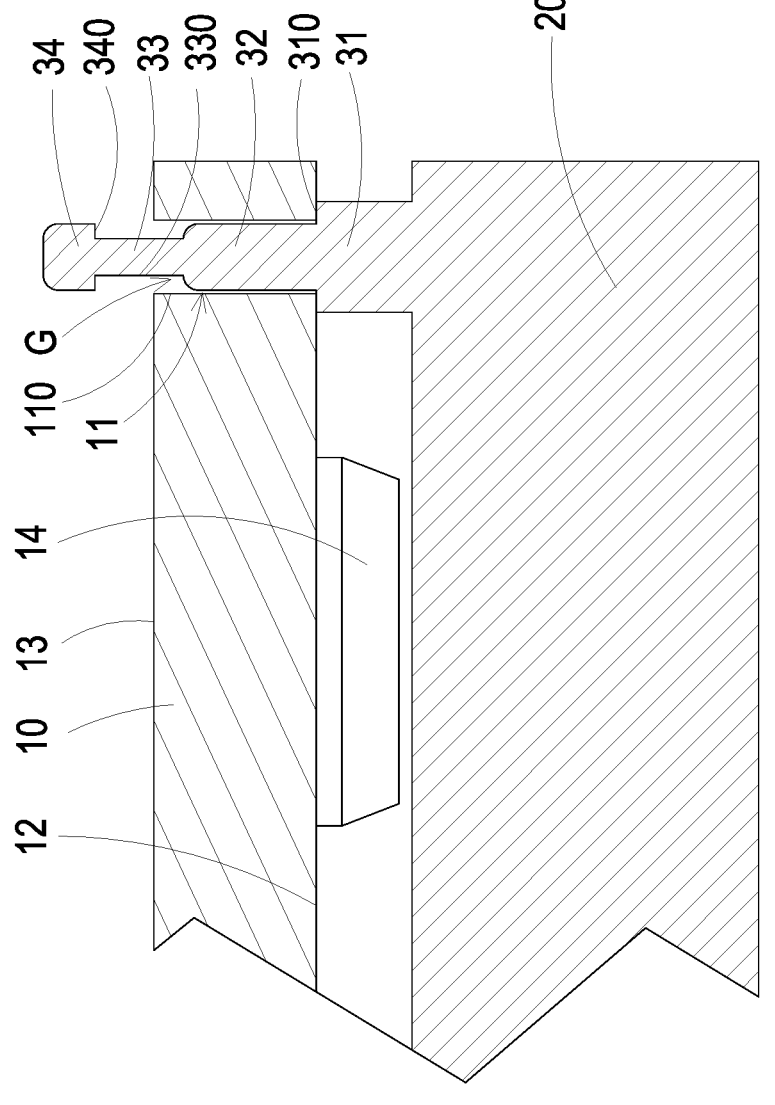
Figure 5C:
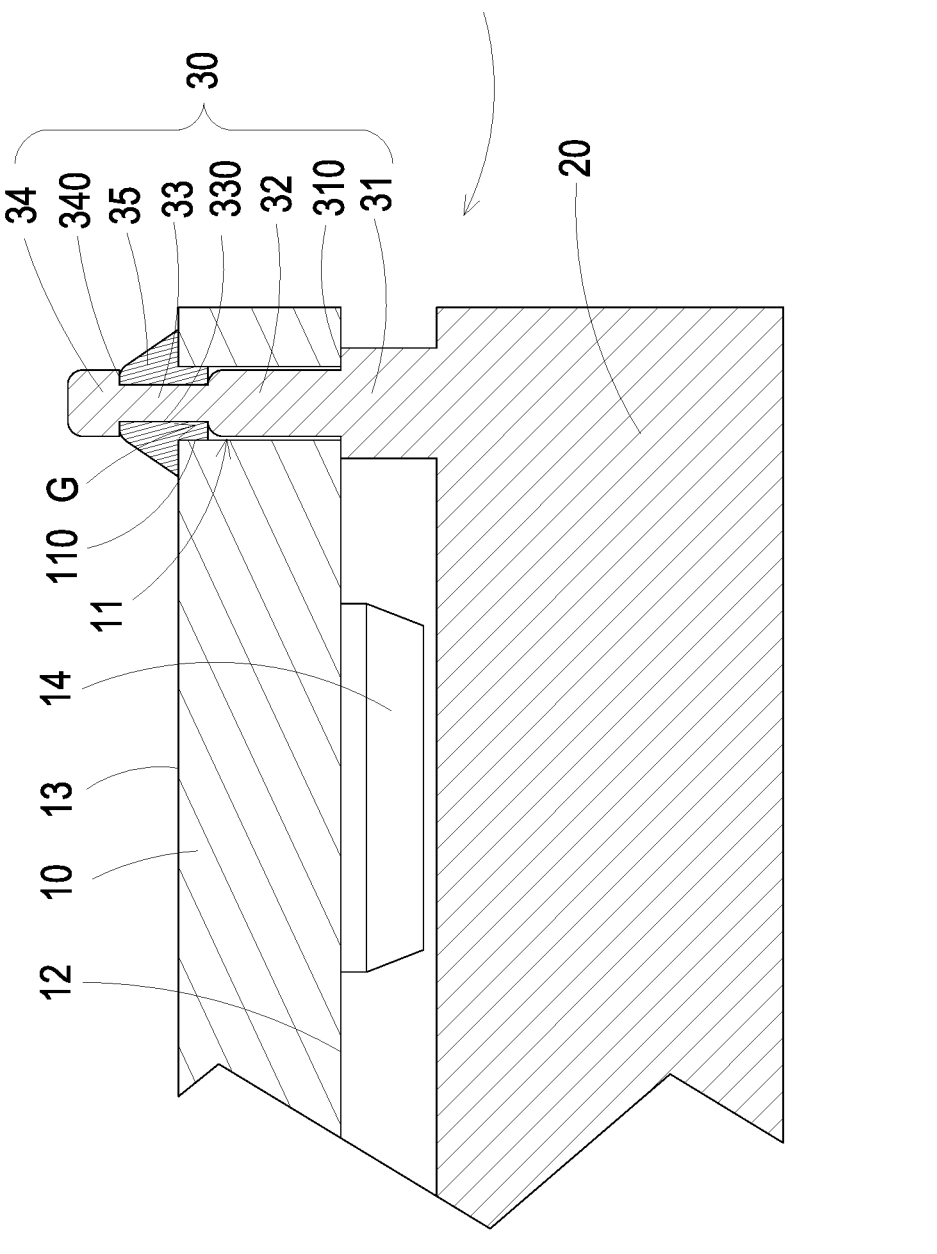

FIGS. 5A to 5C are partial cross-sectional views illustrating an assembling process of the substrate-assembling structure according to the first embodiment of the present disclosure. Please refer to FIG. 1 to FIG. 4, and FIGS. 5A to 5C. In the embodiment, the supporting portion 31, the positioning portion 32, the resin-attaching portion 33 and the end portion 34 are made of a metal material and are integrally formed, so that a hook-shaped structures is collaboratively formed on the base 20. Preferably but not exclusively, the metal material is a steel material or a nickel-plated and tin-plated copper, so as to provide a sufficient mechanical strength. As shown in FIG. 5A, in the embodiment, the hook-like structure formed by the supporting portion 31, the positioning portion 32, the resin-attaching portion 33 and the end portion 34 is integrally formed with the base 20 or connected with each other by mechanical insertion. The present disclosure is not limited thereto. In the embodiment, when the substrate 10 is assembled with the substrate-fastening device 2, the perforation 11 of the substrate 10 is aligned to the fastening component 30, and the hook-shaped structure formed by the supporting portion 31, the positioning portion 32, the resin-attaching portion 33 and the end portion 34 passes through the perforation 11 of the substrate 10. The substrate 10 is supported on the-substrate fastening device 2 by the supporting portion 31, and the supporting surface 310 is attached to the first surface 12 of the substrate 10. Moreover, the substrate 10 is positioned on the base 20 by fitting the positioning portion 32 into the perforation 11 of the substrate 10, as shown in FIG. 5B. Afterwards, with the combination of the fixation resin 35 disposed around the outer peripheral wall 330 of the resin-attaching portion 33 and connected between the end portion 34 and the positioning portion 32, the fixation resin 35 covers a part of the second surface 13 adjacent to a peripheral edge of the perforation 11, and fills the gap G, so as to form a buckle, as shown in FIG. 5C. In that, the substrate 10 is fastened on the substrate-fastening device 2 stably. Moreover, it ensures that the substrate-assembling structure 1 is not disassembled or loosen under the high temperature of reflow soldering process.

Preferably but not exclusively, in the embodiment, the fixation resin 35 is made of an epoxy resin. Since the fixation resin 35 is in a fluid state before baking and curing at a high temperature, it is easy to fill the gap G formed between the inner peripheral wall 110 of the perforation 11 of the substrate 10 and the outer peripheral wall 330 of the resin-attaching portion 33, and be attached to the resin-attaching portion 33 connected between the positioning portion 32 and the end portion 34. After the fixation resin 35 is curried and solidified, the substrate 10 is fastened to the base 20 through the fastening component 30 to form the substrate-assembling structure 1 as a whole. Preferably but not exclusively, when the substrate assembly structure 1 is applied to the fixing of the circuit board and the heat dissipation base plate, the substrate-assembling structure 1 has a sufficient heat resistance and is allowed to withstand the high temperature of multiple reflow soldering processes. Therefore, after the circuit board is fastened to the heat dissipation base plate, additional devices are assembled through multiple reflow soldering processes. It is helpful of increasing the process variability, simplifying the heat dissipation assembling process, and realizing the whole production through the automated processes. Moreover, the purposes of reducing product cost and improving product competitiveness are achieved.

Figure 6C:
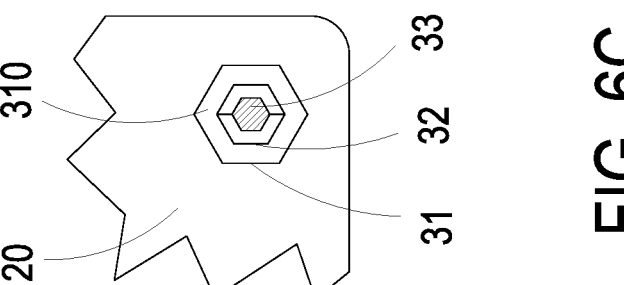
FIGS. 6A to 6C schematically illustrate the cross-sectional shapes of the supporting portion, the positioning
Figure 6B:
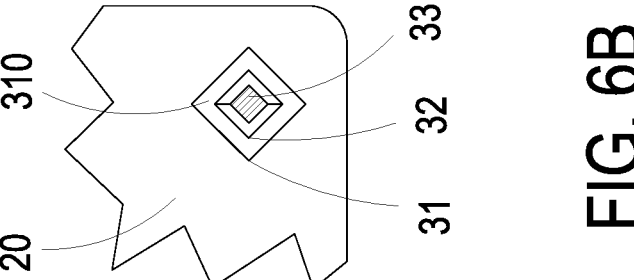
Figure 6A:
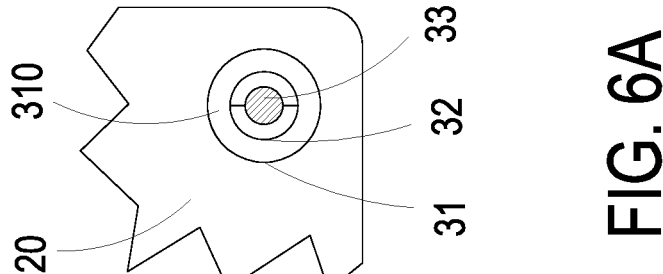

FIGS. 6A to 6C schematically illustrate the cross-sectional shapes of the supporting portion, the positioning portion and the resin-attaching portion of the substrate-fastening device according to different embodiments of the present disclosure. FIG. 7 is a partial lateral view illustrating the relative size relationships of the supporting portion, the positioning portion, the resin-attaching portion and the end portion of the substrate-fastening device according to the first preferred embodiment of the present disclosure. FIG. 8 is a partial cross-sectional view illustrating the relative size relationships of the positioning portion, the resin-attaching portion and the end portion relative to the substrate assembled in the substrate-assembling structure according to the first embodiment of the present disclosure. In the embodiment, the supporting portion 31, the positioning portion 32, the resin-attaching portion 33 and the end portion 34 of the fastening component 30 are in the shape of a column, respectively, and the column has a cross-sectional shape selected from the group consisting of a square, a polygon and a circle. As shown in FIG. 6A, the supporting portion 31, the positioning portion 32 and the resin-attaching portion 33 of the fastening component 30 have the cross-sectional shape of a circle, respectively. As shown in FIG. 6B, the supporting portion 31, the positioning portion 32 and the resin-attaching portion 33 of the fastening component 30 have the cross-sectional shape of a square, respectively. As shown in FIG. 6C, the supporting portion 31, the positioning portion 32 and the resin-attaching portion 33 of the fastening component 30 have the cross-sectional shape of a polygon. Certainly, the present disclosure is not limited thereto. In other embodiments, the supporting portion 31, the positioning portion 32 and the resin-attaching portion 33 of the fastening component 30 have different cross-sectional shapes. Similarly, the end portion 34 has other different cross-sectional shape. It is not redundantly described hereafter. Please refer to FIG. 7 and FIG. 8. In the embodiment, the supporting portion 31 has a circumscribed-circle diameter ØP1. The positioning portion 32 has a circumscribed-circle diameter ØP2. The resin-attaching portion 33 has a circumscribed-circle diameter ØP3. The end portion 34 has a circumscribed-circle diameter ØP4. In addition, the perforation 11 of the substrate 10 has an aperture diameter ØPCB. In the embodiment, the circumscribed-circle diameter ØP1 of the supporting portion 31 is greater than the aperture diameter ØPCB of the perforation 11 of the substrate 10. It ensures that the substrate 10 is supported by the supporting surface 310 of the supporting portion 31. In the embodiment, the circumscribed-circle diameter ØP2 of the positioning portion 32 is equal to or less than the aperture diameter ØPCB of the perforation 11. Preferably but not exclusively, the circumscribed-circle diameter ØP2 of the positioning portion 32 and the aperture diameter ØPCB of the perforation 11 are equal to each other, so as to facilitate the positioning. Considering the influence of dimensional tolerance in the manufacturing processes, the difference between the circumscribed-circle diameter ØP2 of the positioning portion 32 and the aperture diameter ØPCB of the perforation 11 is equal to or less than 0.1 mm, so that the positioning portion 32 is fitted into the perforation 11 of the substrate 10 and matched with each other in position accurately. In the embodiment, the circumscribed-circle diameter ØP4 of the end portion 34 is equal to or less than the aperture diameter ØPCB of the perforation 11. In that, the end portion 34 is allowed to pass through the perforation 11, and the positioning portion 32 is cooperated with the perforation 11 to realize the positioning. Considering the influence of dimensional tolerance in the manufacturing processes, the difference between the aperture diameter ØPCB of the perforation 11 and the circumscribed-circle diameter ØP4 of the end portion 34 is equal to or less than 0.1 mm. In the embodiment, the circumscribed-circle diameter ØP3 of the resin-attaching portion 33 is less than the aperture diameter ØPCB of the perforation 11, and the difference between the aperture diameter ØPCB of the perforation 11 and the circumscribed-circle diameter ØP3 of the resin-attaching portion 33 is equal to or greater than 0.25 mm, in order to form the gap G with a sufficient space between the outer peripheral wall 330 of the resin-attaching portion 33 and the inner peripheral wall 110 of the perforation 11 to fill the fixation resin 35. In the embodiment, the circumscribed-circle diameter ØP3 of the resin-attaching portion 33 is less than the circumscribed-circle diameter ØP4 of the end portion 34, and less than the circumscribed-circle diameter ØP2 of the positioning portion 32. Moreover, the circumscribed-circle diameter ØP3 of the resin-attaching portion 33 is equal to or greater than 0.4 mm, and the circumscribed-circle diameter ØP2 of the positioning portion 32 and the circumscribed-circle diameter ØP4 of the end portion 34 are equal to or greater than 0.7 mm. It is helpful of providing the sufficient mechanical strength and minimizing the occupied area of the fastening component 30 on the substrate 10 at the same time.

In the embodiment, when the fixation resin 35 is formed, the positioning portion 32 has an upper surface away from the first surface 12 of the substrate 10, and a first gap height H1 is formed between the upper surface of the positioning portion 32 and the second surface 13 of the substrate 10. Preferably but not exclusively, the substrate 10 has a substrate height Hpcb formed between the first surface 12 and the second surface 13, and the first gap height H1 is less than the substrate height Hpcb, so as to provide the gap G with a sufficient space to fill the fixation resin 35. In addition, the end portion 34 includes a resin-attaching point, and a second gap height H2 is maintained between the resin-attaching point of the end portion 34 and the second surface 13 of the substrate 10. Preferably but not exclusively, the second gap height H2 is equal to or greater than 0.25 mm, so as to ensure that the resin in the fluid state flows into the gap G formed between the peripheral wall 330 of the resin-attaching portion 33 and the inner peripheral wall 110 of the perforation 11 smoothly. Certainly, the present disclosure is not limited thereto.

FIG. 9A is a partial lateral view illustrating a substrate-fastening device before assembling according to a second embodiment of the present disclosure. FIG. 9B is a partial cross-sectional view illustrating the substrate-assembling structure according to the second embodiment of the present disclosure. In the embodiment, the structures, elements and functions of the substrate-assembling structure 1a are similar to those of the substrate-assembling structure 1 of FIG. 1 to FIG. 8, and are not redundantly described herein. Different from the substrate-assembling structure 1 having an included angle about 90° formed by the contacting surface 340 of the end portion 34 and the outer peripheral wall 330 of the resin-attaching portion 33 in the embodiment of FIG. 1 to FIG. 8, in the embodiment, an included angle θ1=30° is formed by the outer peripheral wall 330 of the resin-attaching portion 33 and the contacting surface 340 of the end portion 34. Before being baked and cured at a high temperature, the fixation resin 35 is in the fluid state, and allowed to flow into the gap G and be attached to the contacting surface 340 and the peripheral wall 330 easily. The effective contact area of the fixation resin 35 in the fluid state formed with the contacting surface 340 of the end portion 34 and the outer peripheral wall 330 of the resin-attaching portion 33 is sufficient to provide the fastening component 30 to fasten the substrate 10 on the substrate-fastening device 2a stably.

FIG. 10A is a partial lateral view illustrating a substrate-fastening device before assembling according to a third embodiment of the present disclosure. FIG. 10B is a partial cross-sectional view illustrating the substrate-assembling structure according to the third embodiment of the present disclosure. In the embodiment, the structures, elements and functions of the substrate-assembling structure 1b are similar to those of the substrate-assembling structure 1 of FIG. 1 to FIG. 8, and are not redundantly described herein. In the embodiment, an included angle θ2=150° is formed by the outer peripheral wall 330 of the resin-attaching portion 33 and the contacting surface 340 of the end portion 34. The effective contact area of the fixation resin 35 in the fluid state formed with the contacting surface 340 of the end portion 34 and the outer peripheral wall 330 of the resin-attaching portion 33 is sufficient to provide the fastening component 30 to fasten the substrate 10 on the substrate-fastening device 2b stably.

From the above, it can be seen that when the included angle by the contacting surface 340 of the end portion 34 and the outer peripheral wall 330 of the resin-attaching portion 33 is ranged from 30° to 150°, it is advantageous of preventing the effective contact area of the fixation resin 35 and the hook-shaped structure from being too small. In an embodiment, the shape of the undercut portion formed by the contacting surface 340 of the end portion 34 and the outer peripheral wall 330 of the resin-attaching portion 33 is designed as a horizontal contacting surface 340 according to the practical requirements. In other embodiments, the contacting surface 340 of the end portion is inclined relative to the horizontal surface at an inclined angle ranged of ±60°, so as to form the included angle between the contacting surface 340 of the end portion 34 and the outer peripheral wall 330 of the resin-attaching portion 33 ranged from 30° and 150°. Certainly, the present disclosure is not limited thereto and not redundantly described herein.

In summary, the present disclosure provides a substrate-fastening device and a substrate-assembling structure using the same. With a hook-shaped structure and a fixation resin combined to form a buckle as the substrate-fastening device, a substrate is fastened to a base stably. It prevents the substrate from moving relative to the substrate-fastening device. The substrate, the base and the substrate-fastening device are combined to form an integrated substrate-assembling structure as a whole, which is allowed to withstand the high temperature during subsequent processes of multiple reflow soldering. Since the fixation resin has the features of good adhesion, strong tensile and compressive strength, and good adaptability to extreme temperatures, and is not easy to peel off, as the hook-sharped structure formed of the metal material is surrounded by the fixation resin to form the buckle, it ensures that the substrate-assembling structure is not disassembled or loosen during the high temperature process of reflow soldering. Furthermore, the hook-shaped structure formed of the metal material has high mechanical strength and occupies a small space on the substrate. It is beneficial to the integrated design of the entire module. When the substrate is fastened to the substrate-fastening device, the bottom surface of the substrate is supported by a supporting portion, and the substrate is sleeved on a positioning portion through the perforation thereof for positioning. The adhesive portion is connected to the end portion with the hook-sharped structure, and combined with the fixation resin to fasten the substrate stably. Since the fixation resin is fluid before curing, it is easy to fill the gap between the perforation of the substrate and the resin-attaching portion, and be attached to the resin-attaching portion between the positioning portion and the end portion. After the fixation resin is cured, the substrate is fastened to the base to form the substrate-assembling structure as a whole, which is allowed to withstand the high temperature processes of multiple reflow soldering. Furthermore, the positioning of the substrate-fastening device and the substrate, and the filling and curing of the fixation resin are allowed to realize the automated production. The stability and high temperature resistance of the substrate-assembling structure are also helpful of withstanding the high temperature during multiple reflow soldering processes, and further achieving fully automated manufacturing. In case of that the substrate assembling structure is applied to the fastening process of the circuit board and the heat dissipation base plate, the devices are assembled through the high-temperature processes of multiple reflow soldering. It is helpful of increasing the process flexibility, simplifying the heat dissipation assembling process, and realizing the fully automated manufacturing. Moreover, the purposes of reducing product cost and improving product competitiveness are achieved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A substrate-fastening device, comprising:
a base configured to correspondingly carry a substrate, wherein the substrate comprises a first surface and a second surface opposite to each other, and at least one perforation, wherein the at least one perforation is passed through the first surface and the second surface along a first direction, and the first surface of the substrate faces the base; and
at least one fastening component disposed on the base and spatially corresponding to each of the at least one perforation in one-to-one correspondence, wherein each of the at least one fastening component comprises:
a supporting portion comprising a supporting surface disposed on the base, wherein the supporting portion is connected between the first surface of the substrate and the base, and the supporting surface is attached to the first surface;
a positioning portion disposed on the supporting surface of the supporting portion and extended along the at least one perforation;
a resin-attaching portion connected to the positioning portion, wherein the resin-attaching portion is extended from an interior of the at least one perforation of the substrate and passes through the second surface, and a gap is formed between an outer peripheral wall of the resin-attaching portion and an inner peripheral wall of the at least one perforation, wherein the at least one perforation is sleeved on the positioning portion and the resin-attaching portion along the first direction, and a circumscribed-circle diameter of the positioning portion is greater than a circumscribed-circle diameter of the resin-attaching portion;
an end portion connected to the positioning portion through the resin-attaching portion; and
a fixation resin disposed around the outer peripheral wall of the resin-attaching portion and connected between the end portion and the positioning portion, wherein the fixation resin covers a part of the second surface adjacent to a peripheral edge of the at least one perforation, and fills the gap.

2. The substrate-fastening device according to claim 1, wherein the end portion comprises a contacting surface, the contacting surface is connected to the outer peripheral wall of the resin-attaching portion, and the fixation resin covers the contacting surface.

3. The substrate-fastening device according to claim 2, wherein an included angle is formed by the contacting surface and the outer peripheral wall, and the included angle is ranged from 30° to 150°.

4. The substrate-fastening device according to claim 1, wherein the supporting portion, the positioning portion, the resin-attaching portion and the end portion are in the shape of a column, respectively, and the column has a cross-sectional shape selected from the group consisting of a square, a polygon and a circle.

5. The substrate-fastening device according to claim 4, wherein a circumscribed-circle diameter of the supporting portion is greater than an aperture diameter of the at least one perforation.

6. The substrate-fastening device according to claim 4, wherein the circumscribed-circle diameter of the positioning portion is equal to or less than an aperture diameter of the at least one perforation, and the difference between the aperture diameter and the circumscribed-circle diameter of the positioning portion is equal to or less than 0.1 mm.

7. The substrate-fastening device according to claim 4, wherein a circumscribed-circle diameter of the end portion is equal to or less than an aperture diameter of the at least one perforation.

8. The substrate-fastening device according to claim 4, wherein the circumscribed-circle diameter of the resin-attaching portion is equal to or less than an aperture diameter of the at least one perforation, and the difference between the aperture diameter and the circumscribed-circle diameter of the resin-attaching portion is equal to or greater than 0.25 mm.

9. The substrate-fastening device according to claim 1, wherein the fixation resin is made of an epoxy resin.

10. The substrate-fastening device according to claim 1, wherein the supporting portion, the positioning portion, the resin-attaching portion and the end portion are made of a metal material and integrally formed.

11. A substrate-assembling structure, comprising:

a substrate comprising at least one perforation, and a first surface and a second surface opposite to each other, wherein the at least one perforation is passed through the first surface and the second surface along a first direction; and a substrate-fastening device comprising:

a base carrying the substrate, wherein the first surface of the substrate faces the base; and at least one fastening component disposed on the base and spatially corresponding to each of the at least one perforation in one-to-one correspondence, wherein each of the at least one fastening component comprises:

a supporting portion comprising a supporting surface disposed on the base, wherein the supporting portion is connected between the first surface of the substrate and the base, and the supporting surface is attached to the first surface;

a positioning portion disposed on the supporting surface of the supporting portion and extended along the at least one perforation;

a resin-attaching portion connected to the positioning portion, wherein the resin-attaching portion is extended from an interior of the at least one perforation of the substrate and passes through the second surface, and a gap is formed between an outer peripheral wall of the resin-attaching portion and an inner peripheral wall of the at least one perforation, wherein the at least one perforation is sleeved on the positioning portion and the resin-attaching portion along the first direction, and a circumscribed-circle diameter of the positioning portion is greater than a circumscribed-circle diameter of the resin-attaching portion;

an end portion connected to the positioning portion through the resin-attaching portion; and a fixation resin disposed around the outer peripheral wall of the resin-attaching portion and connected between the end portion and the positioning portion, wherein the fixation resin covers a part of the second surface adjacent to a peripheral edge of the at least one perforation, and fills the gap.

12. The substrate-assembling structure according to claim 11, wherein the substrate is a circuit board and the base is a heat dissipation device.

13. The substrate-assembling structure according to claim 12, wherein the circuit board comprises at least one electronic device, and the at least one electronic device is disposed on the circuit board by a reflow soldering technique at least.

14. The substrate-assembling structure according to claim 11, wherein the end portion comprises a contacting surface, the contacting surface is connected to the outer peripheral wall of the resin-attaching portion, and the fixation resin covers the contacting surface.

15. The substrate-assembling structure according to claim 14, wherein an included angle is formed by the contacting surface and the outer peripheral wall, and the included angle is ranged from 30° to 150°.

16. The substrate-assembling structure according to claim 11, wherein the supporting portion, the positioning portion, the resin-attaching portion and the end portion are in the shape of a column, respectively, and the column has a cross-sectional shape selected from the group consisting of a square, a polygon and a circle.

17. The substrate-assembling structure according to claim 16, wherein a circumscribed-circle diameter of the supporting portion is greater than an aperture diameter of the at least one perforation.

18. The substrate-assembling structure according to claim 16, wherein the circumscribed-circle diameter of the positioning portion is equal to or less than an aperture diameter of the at least one perforation, and the difference between the aperture diameter and the circumscribed-circle diameter of the positioning portion is equal to or less than 0.1 mm.

19. The substrate-assembling structure according to claim 16, wherein a circumscribed-circle diameter of the end portion is equal to or less than an aperture diameter of the at least one perforation.

20. The substrate-assembling structure according to claim 16, wherein the circumscribed-circle diameter of the resin-attaching portion is equal to or less than an aperture diameter of the at least one perforation, and the difference between the aperture diameter and the circumscribed-circle diameter of the resin-attaching portion is equal to or greater than 0.25 mm.

21. The substrate-assembling structure according to claim 11, wherein the positioning portion has an upper surface away from the first surface of the substrate, and a first gap height is formed between the upper surface of the positioning portion and the second surface of the substrate, wherein the end portion includes a resin-attaching point, and a second gap height is formed between the resin-attaching point of the end portion and the second surface of the substrate, wherein the substrate has a substrate height formed between the first surface and the second surface, the first gap height is less than the substrate height, and second gap height is equal to or greater than 0.25 mm.

22. The substrate-assembling structure according to claim 11, wherein the at least one perforation comprises three perforations disposed adjacent to three corners of the substrate, respectively, and the at least one fastening component comprises three fastening components spatially corresponding to the three perforations.

23. The substrate-assembling structure according to claim 11, wherein the fixation resin is made of an epoxy resin.

24. The substrate-assembling structure according to claim 11, wherein the supporting portion, the positioning portion, the resin-attaching portion and the end portion are made of a metal material and are integrally formed.

25. The substrate-assembling structure according to claim 24, wherein the metal material is a steel material or a nickel-plated and tin-plated copper.

* * * * *